United States Patent [19]

La Barge et al.

[11] Patent Number: 4,799,026
[45] Date of Patent: Jan. 17, 1989

[54] MULTIFUNCTION AMPLIFIER

[75] Inventors: Steven B. La Barge; Leon J. Stanger, both of Grass Valley, Calif.

[73] Assignee: The Grass Valley Group, Inc., Grass Valley, Calif.

[21] Appl. No.: 97,249

[22] Filed: Sep. 16, 1987

[51] Int. Cl.$^4$ .............................................. H03F 3/45
[52] U.S. Cl. ...................................... 330/254; 330/51; 330/147; 330/260; 330/306
[58] Field of Search .................. 330/51, 69, 147, 254, 330/255, 257, 260, 306

[56] References Cited

U.S. PATENT DOCUMENTS

| | | | |
|---|---|---|---|
| 3,517,270 | 6/1970 | Dilley | 330/147 X |
| 3,706,936 | 12/1972 | Krohn | 330/306 X |
| 4,532,482 | 7/1985 | Noguchi | 330/254 X |

FOREIGN PATENT DOCUMENTS 46508  3/1982  Japan ..................................... 330/51

Primary Examiner—James B. Mullins
Attorney, Agent, or Firm—Francis I. Gray

[57] ABSTRACT

A multifunction amplifier uses a finite transconductance amplifier to provide an amplifier with a high impedance input and a desired output impedance. A pair of appropriate polarity binary signals are summed to form a ternary signal which may be filtered by a filter circuit upon command. The ternary signal, filtered or unfiltered, is input to one input of a differential transconductance amplifier while a feedback signal via a feedback path from an output node of the finite transconductance amplifier is input to the other input. The outputs of the differential transconductance amplifier are equally amplified by a pair of output current gain amplifiers. A unity gain bias level shifter is provided between one of the differential outputs and one of the pair of output amplifiers. The output amplifiers combine the amplified output currents at the output node. The finite transconductance of the finite transconductance amplifier is determined by the emitter resistors of the differential transconductance and output amplifiers, and the desired output impedance is a function of a feedback resistor that forms the feedback path, an input resistor to the differential transconductance amplifier and the finite transconductance. A current switch connects a constant current source to the differential transconductance amplifier to provide current bias upon command, the desired output impedance appearing at the output node when the current source is conducting and an essentially infinite output impedance appearing at the output node when the current source is not conducting.

7 Claims, 2 Drawing Sheets

MULTIFUNCTION AMPLIFIER

BACKGROUND OF THE INVENTION

The present invention relates to feedback amplifiers, and more particularly to a multifunction amplifier having a finite transconductance to provide a finite output impedance.

A typical feedback amplifier has an open loop gain block with arbitrarily large gain. It has an input resistor and a feedback resistor between the input and output of the amplifier. The overall voltage gain depends only upon the input and feedback resistor values. The output impedance approaches zero ohms due to the arbitrarily large open loop gain. An amplifier which is intended to drive a transmission line needs to have an output impedance which matches the line impedance. To establish this finite output impedance, common practice is to provide a "buildout" resistor between the amplifiers zero impedance output and the line. The required output voltage swing at the output of the amplifier must be twice that at the input of the transmission line. Amplifiers of this type have been used, for example, as video amplifiers, such as in the Horizon Video Routing Switcher manufactured by Grass Valley Group, Inc. of Grass Valley, Calif.

Finite output impedance has also been achieved by the combined use of positive and negative feedback in audio output amplifiers, such as in the 3280 Digital Audio Multiplex System manufactured by Grass Valley Group, Inc. of Grass Valley, Calif. To achieve a specific output impedance a small value, less than the actual desired output impedance, buildout resistor is inserted in series with the output of the amplifier. One of the feedback paths is taken from the output of the buildout resistor to the positive input of the amplifier and the other feedback path is taken conventionally from the output of the amplifier to the negative input of the amplifier. The positive feedback raises the effective impedance of the small valued buildout resistor and reduces the required voltage swing at the output of the amplifier compared to that required with the conventional buildout approach. This in turn reduces the power supply voltage requirements.

For communications over a telecommunications network which uses a ternary coded digital signal, binary input signals have to be combined, shaped and buffered before being amplified for transmission. What is desired is a multifunction amplifier which uses minimal power supply voltage while accepting binary inputs and producing a ternary output suitable for transmission over the telecommunications network.

SUMMARY OF THE INVENTION

Accordingly the present invention provides a multifunction amplifier having a core open loop amplifier with finite transconductance which is used to provide a specific closed lop output impedance. Binary input signals are resistively summed to produce a ternary signal which may be low pass filtered to simulate cable loss before being input to the amplifier. The output of the amplifier is applied for transmission over a telecommunications network. Emitter resistors in differential pair and current mirror stages of the amplifier provide degeneration so that the transconductance is finite and predictable, resulting in a predictable output impedance.

The objects, advantages and novel features of the present invention will be apparent from the following detailed description when read in conjunction with the appended claims and attached drawing.

DESCRIPTION OF THE PREFERRED EMBODIMENT

Figure 1:
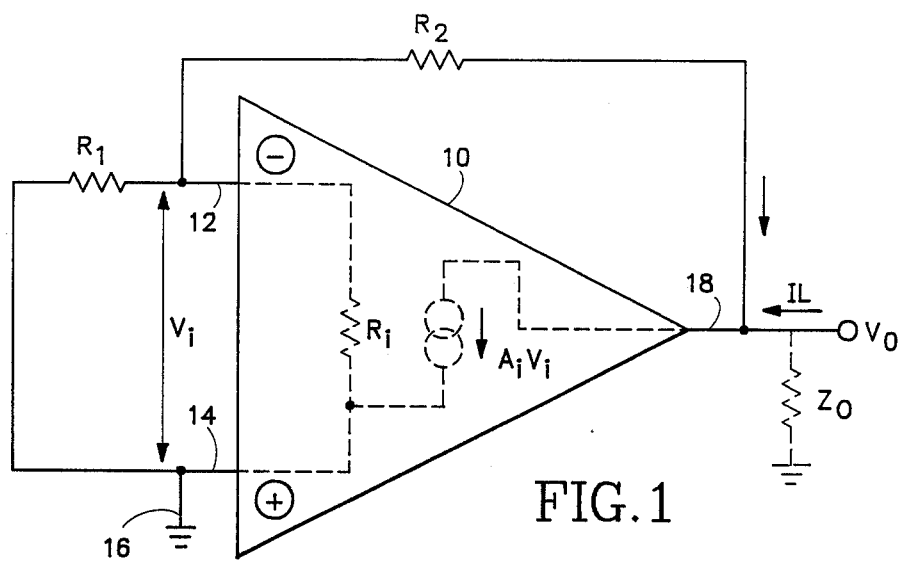
FIG. 1 is a block diagram of a finite transconductance amplifier according to the present invention.

Referring now to FIG. 1 a finite transconductance amplifier 10 has an input resistor R1 connected between one input terminal 12 and a constant potential rail 16, such as ground, with the other input terminal 14 also being returned to the constant potential rail. A feedback resistor R2 is connected between an output terminal 18 of the amplifier 10 and the one input terminal 12. The transconductance of the amplifier Ai is set to a finite value, as will be described subsequently. The current AiVi through the amplifier 10 is the sum of the load current IL and the feedback current $(Vi - Vo)/R2$:

$$AiVi = IL + (Vi - Vo)/R2$$

or $$Vi = (R2IL - Vo)/(AiR2 - 1), \qquad (1)$$

and also $$Vi = Vo\{R1Ri/(R1+Ri)\}/\{R2+R1Ri/(R1+Ri)\}.$$

For Ri substantially greater than R1 this reduces to:

$$Vi = VoR1/(R1+R2). \qquad (2)$$

Combining equations (1) and (2) produces:

$$VoR1/(R1+R2) = (R2IL - Vo)/(AiR2 - 1).$$

Since the output impedance Zo equals the output voltage divided by the load current, solving for Vo/IL produces:

$$Zo = (R1+R2)/(1+AiR1).$$

As is apparent for the normal feedback amplifier with the normal infinite open loop transconductance of infinity, Zo is approximately zero. However, by controlling the transconductance to be a finite value, appropriate values for the input and feedback resistors R1, R2 can be determined for a desired output impedance Zo to match a transmission line without the need for a buildout resistor at the output terminal 18 of the amplifier 10.

Figure 2:
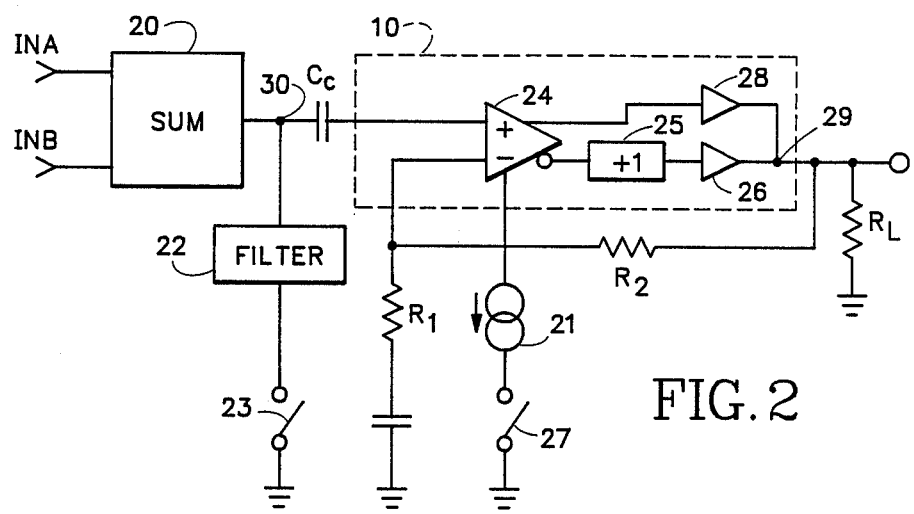
FIG. 2 is a block diagram of a multifunction amplifier using the finite transconductance amplifier.

As shown in FIG. 2 two binary input signals INA, INB are input to a summer 20 to produce a ternary signal output. The ternary signal output is filtered by a line loss simulator filter circuit 22 controlled by a filter switch 23. The filtered ternary signal is input to the noninverting input of a differential transconductance amplifier 24 via a coupling capacitor Cc, the differential transconductance amplifier being part of the overall finite transconductance amplifier 10 and converting the voltage input to a current output. The inverted current output from the differential transconductance amplifier 24 is buffered by a unity gain bias level shifter 25 and input to a first current gain amplifier 26. The noninverted current output from the differential transconductance amplifier 24 is input to a second current gain amplifier 28. The outputs of the current gain amplifiers 26, 28 are summed at node 29. The output at node 29 also is fed back to the inverting input terminal of the differential transconductance amplifier 24 via the feedback resistor R2. Input resistor R1 is connected between the inverting input terminal of the buffer and a.c. ground. As a result the output at node 29 is an impedance matched ternary signal ready for transmission over a network having a characteristic impedance indicated by a load resistor RL. The differential transconductance amplifier 24 is controlled by a current source 21 which is turned off by a current source switch 27.

Figure 3:
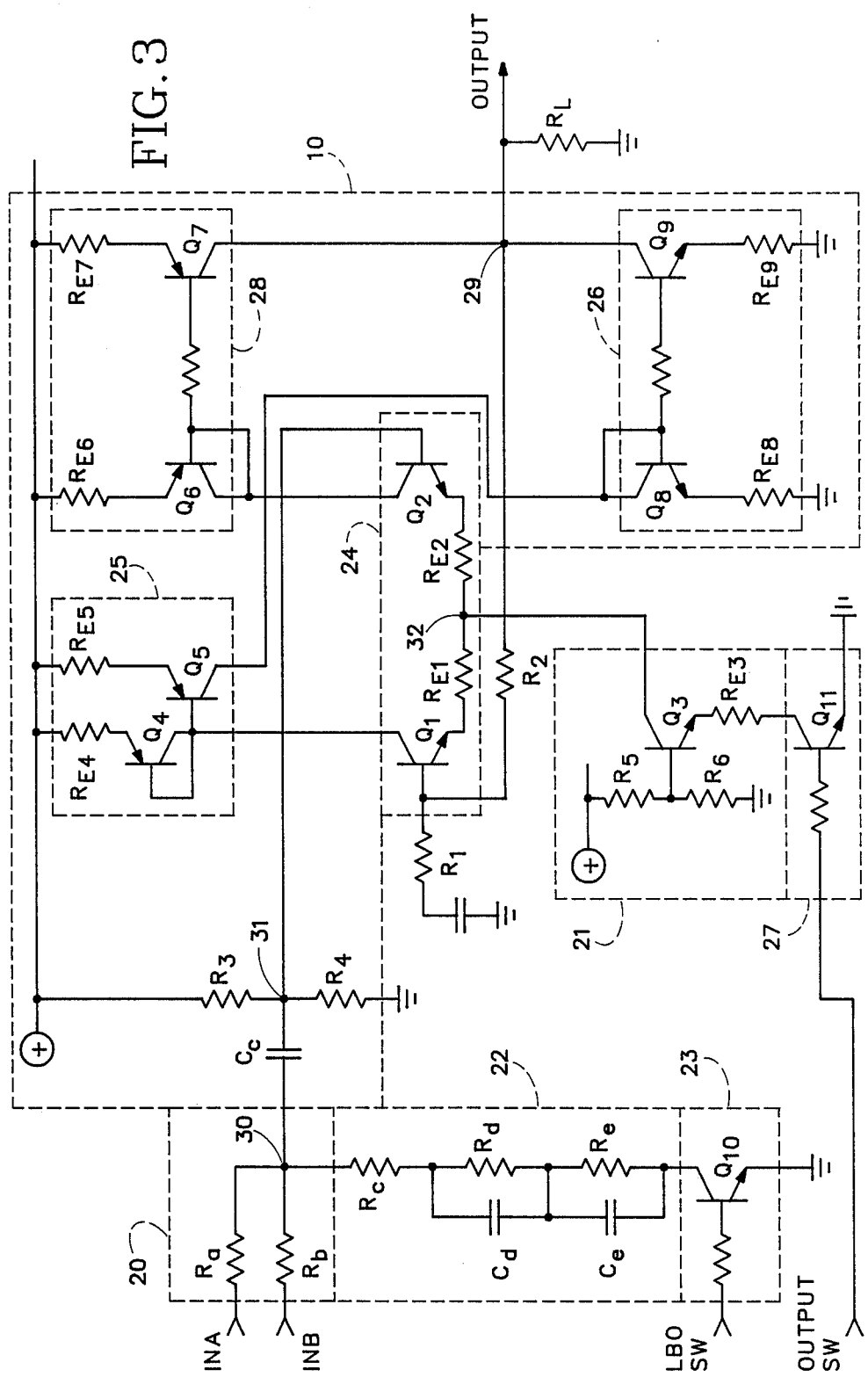
FIG. 3 is a schematic diagram of one implementation of the multifunction amplifier.

The summer 20 as shown in FIG. 3 may be respective input resistors Ra, Rb connected to a common node 30. Also connected to the common node 30 is the filter circuit 22 of resistors Rc, Rd, Re and capacitors Cd, Ce which, combined with input resistors Ra, Rb, form a low pass filter. The filter switch 23 is connected to the filter circuit 22 opposite the common node 30 and may be implemented by a transistor Q10 having a Line Build Out (LBO) command applied to the base to turn the transistor on and off. The emitter of the switch transistor Q10 is tied to a common rail. The common node 30 is connected to one side of the coupling capacitor Cc, and the other side of the capacitor is connected to a bias node 31 formed by the junction of bias resistors R3, R4 connected between a power supply voltage rail and the common rail. The bias node is connected to the base of Q2, one of two transistors which form the differential transconductance amplifier 24. The other transistor Q1 has the input resistor R1 connected between the base and a.c. ground. The emitters of Q1, Q2 are connected via respective emitter resistors RE1, RE2 to a current source node 32 to which is connected the current source 21. The current source 21 may be a transistor Q3 biased to a constant voltage state by resistors R5, R6 connected between the power supply voltage rail and the common rail. The transistor Q3 also has an emitter resistor RE3 to establish the current source value which is connected between the emitter and the current source switch 27. The current source switch 27 may be implemented in a similar manner as the filter switch 23 with transistor Q11 having an output on/off command applied to the base.

The collector of transistor Q1 of the differential transconductance amplifier 24 is connected to the bias level shifter/unity gain current mirror amplifier 25 which is composed of transistors Q4 and Q5 together with resistors RE4 and RE5. The current flowing in the collector of Q1 is mirrored by amplifier 25, i.e., the same value of current that flows in the collector of Q1 flows in the collector of Q5. Q8 and Q9 together with resistors RE8 and RE9 make up the first current gain amplifier 26 whose current gain is approximately RE8 divided by RE9, the collector of Q8 being connected to the collector of Q5. The current flowing in the collector of Q9 is the RE8/RE9 ratio times the current in the collector of Q8. Q6 and Q7 together with RE6 and RE7 form the second current gain amplifier 28 which is the same kind of current gain amplifier as amplifier 26 with the collector of Q6 being connected to the collector of Q2. The current gain of amplifier 28 is approximately RE6 divided by RE7. The collectors of Q7 and Q9 are connected together at node 29 which is the output terminal. Resistor R2 is part of the feedback network and is connected between the output node 29 and the base of transistor Q1. Resistor R1 is also part of the feedback network and is connected from the base of transistor Q1 and the a.c. ground.

In operation binary signals of appropriate polarities are input at INA and INB to the summer 20 to produce the ternary signal at node 30. The ternary signal is input to the finite transconductance amplifier 10 at the base of Q2 and a portion of the output signal is input via feedback resistor R2 at the base of Q1. The outputs of the differential transconductance amplifier 24 are amplified equally by respective amplifiers 26, 28, the input to amplifier 26 being via the unity gain amplifier 25. The collectors of the output transistors Q7, Q9 are tied together to produce the output ternary signal. Appropriate filtering of the input ternary signal may be switched in by turning on transistor Q10. The current source 21 for the buffer amplifier 24 may be switched on and off by turning on and off transistor Q11. The transconductance of the finite transconductance amplifier 10 between the input at node 31 and the output at node 29 is determined mainly by the emitter resistors RE1, RE2, RE6, RE7, RE8 and RE9 of the differential transconductance amplifier 24 and the output amplifiers 26, 28. The resulting output provides the ternary signal with a finite output impedance Zo when the amplifier 10 is on, and an infinite output impedance when the amplifier is off. The amplifier 10 also provides a high impedance load to the filter circuit 22 allowing a simpler filter design.

Thus, the present invention provides a multifunction amplifier that provides an output impedance suitable for line matching without a buildout resistor, resulting in a lower value power supply voltage rail, and a high impedance output impedance when turned off by using a finite transconductance amplifier, providing a high impedance input and the desired output impedance characteristics.

What is claimed is:
1. A multifunction amplifier comprising:
   a finite transconductance amplifier having a high input impedance and a desired output impedance, the desired output impedance being a function of an input resistor, a feedback resistor and a finite transconductance for the finite transconductance amplifier; and
   means for controlling the finite transconductance amplifier by turning on and off a current source supplying current bias for the finite transconductance amplifier such that when turned off the finite transconductance amplifier has an essentially infinite output impedance and when turned on has the desired output impedance.

2. A multifunction amplifier as recited in claim 1 further comprising means for transforming a pair of appropriate polarity binary signals into a ternary signal, the transforming means being connected to the input of the finite transconductance amplifier to provide the ternary signal as an input signal.

3. A multifunction amplifier as recited in claim 1 further comprising:
   means for filtering an input signal to simulate a cable loss characteristic, the filtering means being connected to the finite transconductance amplifier to apply the filtered input signal to the input of the finite transconductance amplifier; and means for bypassing the filtering means such that the input signal is input directly to the finite transconductance amplifier upon receipt of a bypass command.

4. A multifunction amplifier as recited in claim 1 wherein the finite transconductance amplifier comprises:
a differential amplifier having two inputs and two outputs, an input signal being input to one input and a feedback signal being input to the other input; and
a pair of output amplifiers connected to respective differential amplifier outputs to amplify signals occurring at the respective outputs, the pair of output amplifiers being connected to each other to provide a common output node, the feedback signal being taken from the common output node.

5. A multifunction amplifier as recited in claim 4 wherein the differential amplifier comprises a pair of transistors connected as a common emitter differential amplifier, the transistors each having an emitter resistor connected to a current node which is supplied with current by the current source, the input signal being input to the base of one transistor and the feedback signal being input to the base of the other transistor, the finite transconductance being a function of the emitter resistors.

6. A multifunction amplifier as recited in claim 4 wherein the output amplifiers comprise common emitter transistor amplifiers having emitter resistors, the finite transconductance being a function of the emitter resistors.

7. A multifunction amplifier as recited in claim 4 wherein the finite transconductance amplifier further comprises a unity gain bias level shifter connected between one of the outputs of the differential amplifier and the input of respective one of the pair of output amplifiers.

* * * * *